(12) United States Patent
Katchmar

(10) Patent No.: US 6,392,890 B1
(45) Date of Patent: May 21, 2002

(54) METHOD AND DEVICE FOR HEAT DISSIPATION IN AN ELECTRONICS SYSTEM

(75) Inventor: Roman M. Katchmar, Nepean (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/739,688

(22) Filed: Dec. 20, 2000

(51) Int. Cl.$^7$ ................................................ H05K 7/20
(52) U.S. Cl. ........................ 361/705; 174/252; 257/717; 361/719; 428/40.5
(58) Field of Search ................................ 174/252, 16.3; 257/705, 706, 713, 717, 718; 361/704, 705, 707, 712, 717–719; 165/80.3, 185; 156/247, 306.6, 324.4; 428/40.5, 41.3, 41.8, 220

(56) References Cited

U.S. PATENT DOCUMENTS

| | | | |
|---|---|---|---|
| 4,092,697 A | * 5/1978 | Spaight | 361/718 |
| 4,914,551 A | * 4/1990 | Anschel et al. | 361/714 |
| 5,053,195 A | 10/1991 | MacKay | 420/555 |
| 5,056,706 A | 10/1991 | Dolbear et al. | 228/180.2 |
| 5,218,516 A | 6/1993 | Collins et al. | 361/386 |
| 5,276,584 A | 1/1994 | Collins et al. | 361/718 |
| 5,276,586 A | * 1/1994 | Hatsuda et al. | 361/705 |
| 5,467,251 A | 11/1995 | Katchmar | 361/719 |
| 5,646,826 A | 7/1997 | Katchmar | 361/704 |
| 5,661,902 A | 9/1997 | Katchmar | 29/840 |
| 5,796,582 A | 8/1998 | Katchmar | 361/704 |
| 6,054,198 A | * 4/2000 | Bunyan et al. | 8/41.3 |

OTHER PUBLICATIONS

Gallium Alloy—breakthrough for via–filling application, "A Low–Temperature Processable Ternary Gallium Alloy Proves Useful For Microelectronic Packaging Interconnects", Swapan K. Bhattacharya and Daniel F. Baldwin, Sep. 2000, Advanced Packaging, pp. 61, 63 and 64.

"Preparation and Properties of Gallium Alloys for Use as Microelectrinic interconnect Materials", Daniel F. Baldwin, et al, The International Jounal of Microcircuits and Electronic Packaging, vol. 19, No. 1, First Quarter 1996 (ISSN 1063–1674), pp. 37–45.

"Amalgans as Alternative Bonding Materials", Colin A. MacKay, Microelectronics Computer Technology Corpn., Augstin, Texas, pp. 1244–1259.

"Amalgans for Electronics Interconnect", G. Schuldt and C. MacKay, Proceedings of the 7th Electronic Materials and Processing Congress, Cambridge, Massachusetts, USA, Aug. 24–27, 1992, pp. 141–147.

"Liquid Metal Pastes for Thermal Connections", T. Dolbear, Proceedings of the 7th Electronic Materials and Processing Congress, Cambridge, Massachusetts, USA, Aug. 24–27, 1992, pp. 133–139.

* cited by examiner

Primary Examiner—Gerald Tolin

(57) ABSTRACT

The invention relates to a method and a device for creating a thermally conductive path between a component of a printed circuit board and a heat sink using a electrical insulator material and a thermally conductive material. The electrical insulator material is adhesive, to assist in adhering surfaces against which it is applied. Typically, the circuit board is affixed to the heat sink, creating a gap between the component and the heat sink. The electrical insulator material is applied in the gap. Then, the thermally conductive material is applied within the electrical insulator material, causing the thermally conductive material to spread beyond the perimeter of the electrical insulator material. The electrical insulator material thus confines the thermally conductive material within the gap in thermally conductive contact between the electronic component and the heat sink.

16 Claims, 4 Drawing Sheets

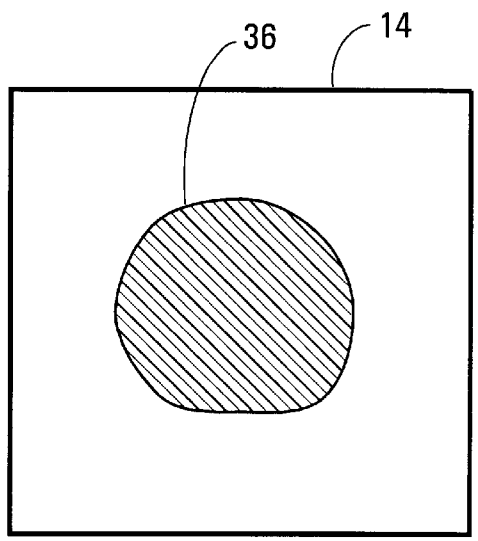
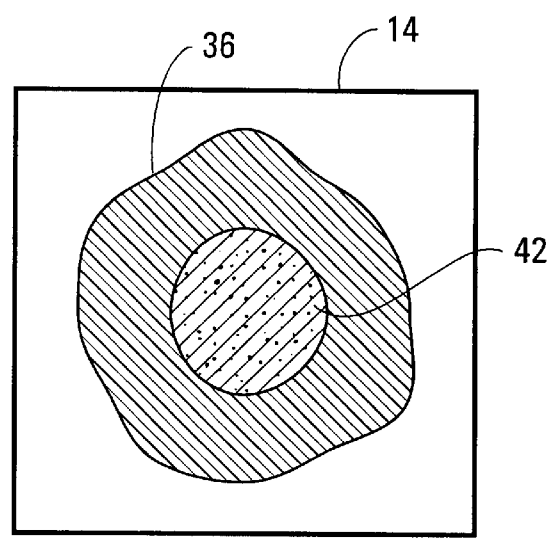
FIG. 2a           FIG. 2b
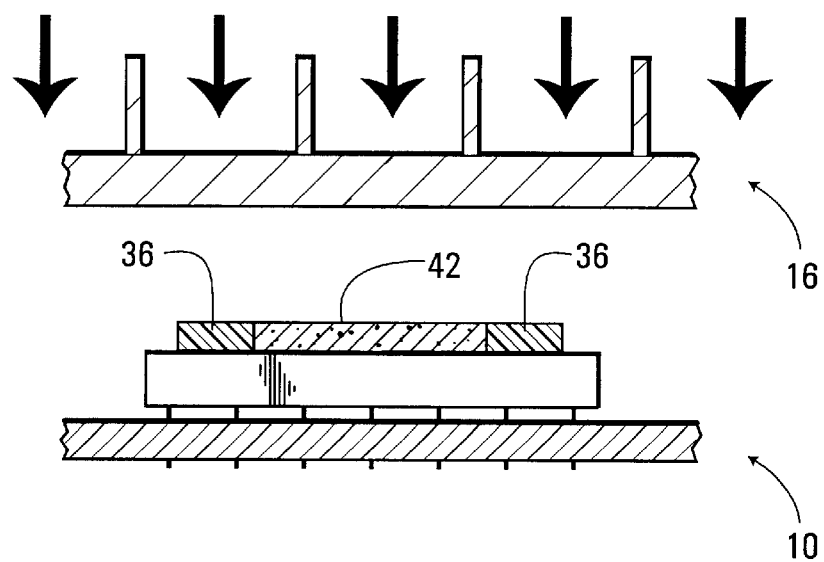
FIG. 2c

METHOD AND DEVICE FOR HEAT DISSIPATION IN AN ELECTRONICS SYSTEM

FIELD OF THE INVENTION

The invention relates to heat dissipation and is particularly concerned with heat transfer between electronic components and heat sinks.

BACKGROUND OF THE INVENTION

In electronics systems, such as printed circuit boards carrying electronic components, heat is generated by the components in use and it is necessary to remove or dissipate heat to prevent over heating which could result in breakdown of one or more of the components and/or create a fire hazard. To remove or dissipate heat, heat sinks have been implemented.

To ensure that heat flows from the electronic components to the heat sink, a heat transfer medium is typically interposed between the components and the heat sink, since it would otherwise be difficult to ensure proper contact between the electronic components and the heat sink. One type of heat transfer medium used has been non-electrically conductive matrix resin. Because of the risk of a short circuit in an electronic system if the heat transfer medium is electrically conductive, non-electrically conductive media, such as that noted above, have been used. However, non-electrically conductive media are typically relatively poor thermal conductors. Accordingly, it would be desirable to achieve better thermal conductivity between electronic components and a heat sink.

SUMMARY OF THE INVENTION

According to a first aspect, the invention provides a method for creating a thermally conductive path between a component of a printed circuit board and a heat sink using an electrical insulator material and a thermally conductive material. The electrical insulator material is adhesive, to assist in adhering surfaces against which it is applied. Typically, the circuit board is affixed to the heat sink, creating a gap between the component and the heat sink. The electrical insulator material is applied in the gap. Then, the thermally conductive material is applied within the electrical insulator material, causing the thermally conductive material to spread beyond the perimeter of the electrical insulator material. The electrical insulator material confines the thermally conductive material within the gap in thermally conductive contact between the electronic component and the heat sink.

According to another aspect, the invention provides a method for creating a thermally conductive path between a component of a printed circuit board and a heat sink using a electrical insulator material and a thermally conductive material. The electrical insulator material is adhesive, to assist in adhering surfaces against which it is applied. The electrical insulator material is applied to either the heat sink or the electronic component (or a covering of either the heat sink or the electronic component). Then, the thermally conductive material is applied within or on top of the electrical insulator material. The printed circuit board is then affixed to the heat sink, such that the thermally conductive material creates a thermally conductive path from the component to the heat sink. The electrical insulator material confines the thermally conductive material to a volume between the electronic component and the heat sink.

According to another aspect, the invention provides an electronics system having a heat sink structure and a printer circuit board structure. The circuit board structure has a printed circuit board with at least one electronic component mounted thereon. The heat sink structure and the circuit board structure are affixed to each other with a gap between the electronic component and the heat sink structure. The electronics system has a means for creating a thermally conductive path from the heat sink structure to the electronic component. The means comprises both a good thermally conductive, electrically conductive material and an electrical insulator material between the electronic component and the heat sink structure with the good thermally conductive electrically conductive material being confined by the electrical insulator.

Advantageously, different embodiments of the present invention may permit: improved thermal conductivity or heat dissipation between electronic components on a printed circuit board and a heat sink; and/or electrical grounding of the electronic components to the heat sink.

BRIEF DESCRIPTION OF THE DRAWINGS

Preferred embodiments of the invention will now be described with reference to the attached drawings in which:

FIG. 2a is a top view of an electronic component with a electrical insulator material applied in accordance with another aspect of the present invention;

FIG. 2b is the top view of FIG. 2a with a good thermally conductive material applied within or on top of the electrical insulator material;

FIG. 2c is a cross-sectional view of the heat sink structure being brought towards the printed circuit board structure.

DETAILED DESCRIPTION

Figure 1A:
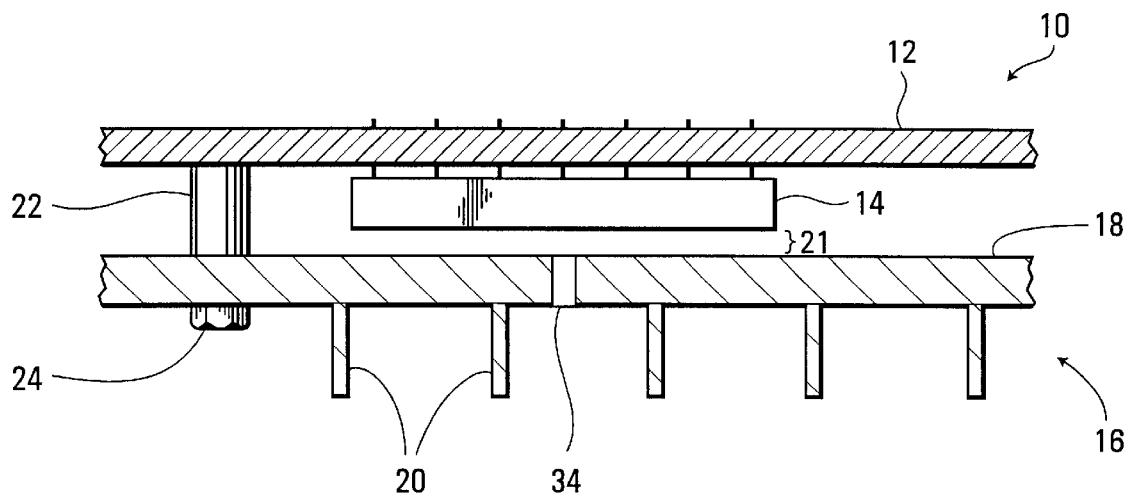
FIG. 1a is a cross-sectional view through a printed circuit board structure and a heat sink structure before either a electrical insulator material or a good thermally conductive material is applied.

In a first embodiment as shown in FIG. 1a, a printed circuit board structure 10 comprises a printed circuit board 12 having a plurality of electronic components 14 (only one component 14 being shown) mounted upon one side of the printed circuit board 12. For removal of heat from the printed circuit board structure 10 during use, a heat sink structure 16 is provided. The heat sink structure 16, in this example, comprises a planar body 18 from one side of which a plurality of parallel and spaced apart heat cooling fins 20 extend and are directed outwardly from the side of the planar body 18 remote from the printed circuit board structure 10. The printed circuit board structure 10 and the heat sink structure 16 are maintained in a detachably fixed, spaced apart relationship by spacer columns 22 (one being shown) which are held in position by bolts or securing screws 24 extending either through the planar body 18 of the heat sink structure 16 as shown, or through the printed circuit board 12.

A spatial region or gap 21 separates the components 14 from the planar body 18 of the heat sink structure 16. The height of the gap 21 may depend upon the size of the components 14 and may vary from one component 14 to another.

The planar body 18 of the heat sink structure 16 optionally has formed therein one or more holes 34. As shown in the figures, the axis of a hole 34 extends generally towards the electronic component 14 and the hole 34 is optionally generally centrally aligned with respect to the component 14.

Each component 14 may be fitted with an overmold or direct lid attachment (DLA) or similar cover or device (not shown) which would be interposed between the components 14 and the gap 21. As used hereinafter in the specification and in the claims, the expression "electronic component" means either the electronic component 14 itself where there is no overmold, DLA or other cover or the electronic component 14 in addition to the DLA (or overmold or other cover) in the case where a DLA (or overmold or other cover) is provided.

To thermally conductively connect the printed circuit board structure 10 to the heat sink structure 16 for removal of heat from the printed circuit board structure 10 out through the heat sink structure 16, two compounds or materials 36, 42 are interposed between the components 14 and the planar body 18 as described below.

Figure 1B:
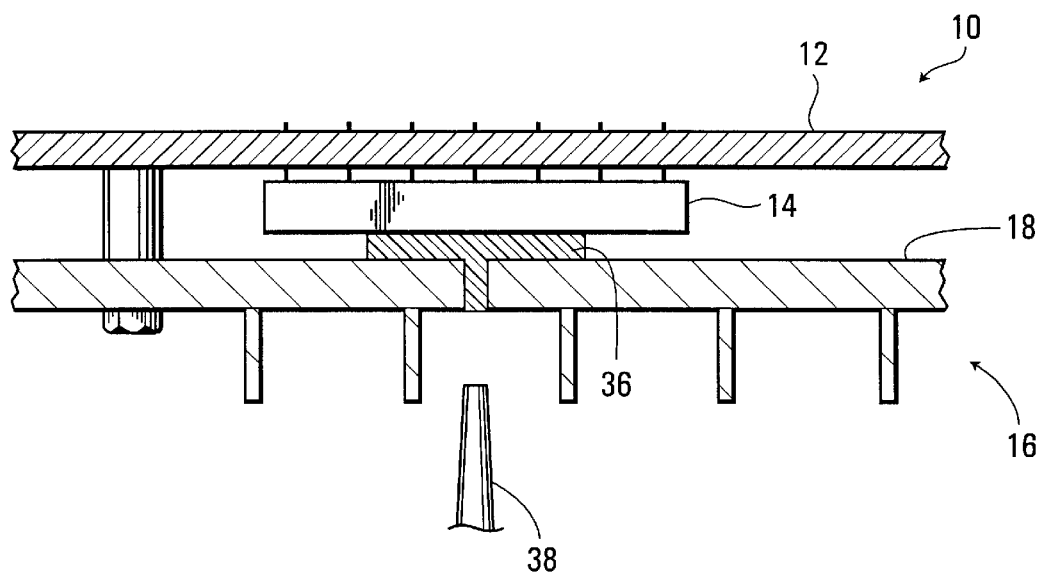
FIG. 1b is the cross-sectional view of FIG. 1a with a electrical insulator material applied in accordance with an aspect of the present invention.

Then as suggested in FIG. 1b, an injection nozzle 38 is inserted into or disposed adjacent the opening of the hole 34 at a surface of the planar body 18 remote from the component 14, and a mass of an electrical insulator material 36 is injected through the hole 34 so as to flow into and expand progressively within the gap 21 between the component 14 and the planar body 18. The electrical insulator material 36 has an ability to flow at processing temperatures and may optionally be a liquid, a slurry, a paste, a viscous paste or a gel at processing temperatures.

Figure 1C:
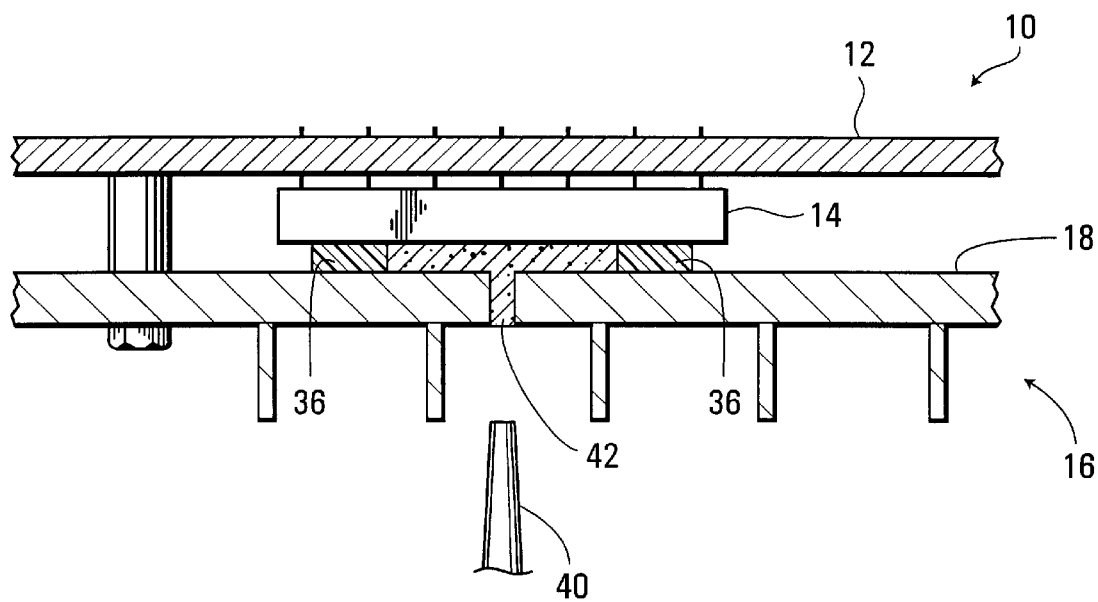
FIG. 1c is the cross-sectional view of FIG. 1b after a good thermally conductive material is applied.

Then as suggested in FIG. 1c, an injection nozzle 40 (which could be the same as or different from the injection nozzle 38) is inserted into or disposed adjacent the opening of the hole 34 and a mass of a good thermally conductive material 42 is injected through the hole 34 so as to flow into and expand progressively within the gap 21 to be substantially surrounded by and contained in a volume of the gap 21 as defined by the component 14 (or the overmold or DLA (not shown)), the planar body 18 and the electrical insulator material 36.

Figure 1D:
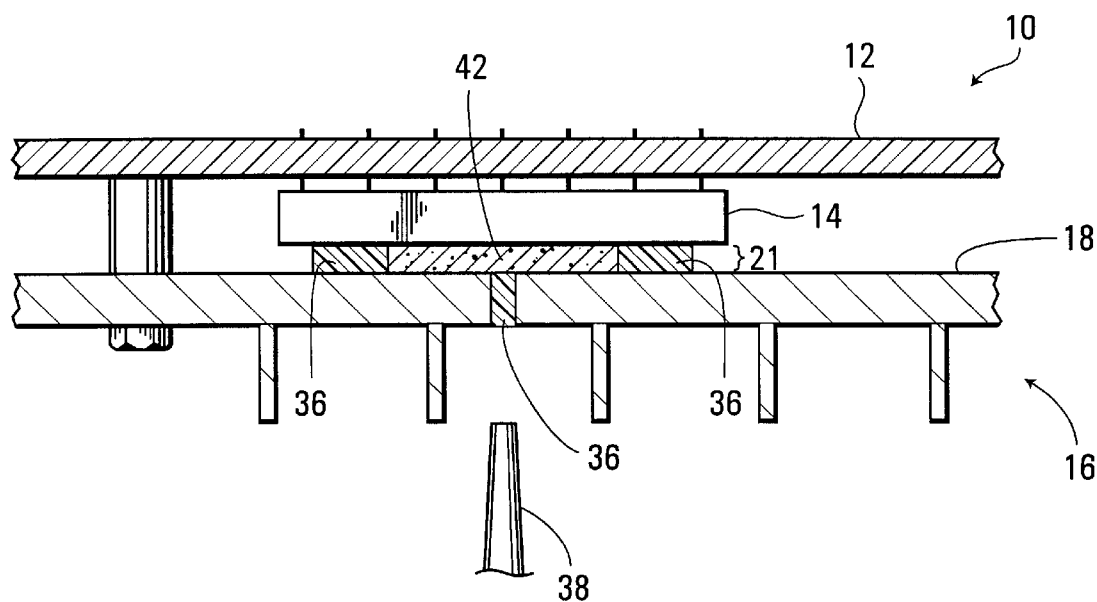
FIG. 1d is the cross-sectional view of FIG. 1c after an additional portion of the electrical insulator material is applied.

Then as suggested in FIG. 1d, the injection nozzle 38 is inserted into or disposed adjacent the opening of the hole 34 and an additional mass of the electrical insulator material 36 is injected into the hole 34 to confine the good thermally conductive material within the gap 21 by blocking off the opening of the hole 34. The additional electrical insulator material 36 may optionally be injected so as to substantially push all of the good thermally conductive material 42 out of the hole 34 and into the gap 21. However, ideally, as shown in FIG. 1d, the additional electrical insulator material 36 is not injected into the gap 21.

As shown in FIGS. 1c and 1d, for example, the good thermally conductive material 42 is positioned so as to be in direct contact with both a surface of the component 14 and a surface of the planar body 18.

The electrical insulator material 36 is a suitable material being a poor electrical conductor and being able to intimately contact the surfaces against which it has been injected. More specifically, the material 36 has viscous properties and adhesive properties to assist in adhering the surfaces against which it has been injected and to confine the thermally conductive material 42. In other words, the electrical insulator material 36 has good flow control at processing temperatures before setting or curing at room temperature and ideally, upon setting, acts as a compliant seal having mechanical integrity. However, the electrical insulator material 36 could be designed to cure at any temperature. The electrical insulator material 36 is optionally a dielectric or electrically isolating overfill material such as, for example, silicone rubber, silicone gel, fluoro silicone rubber, acrylates, epoxy, natural rubbers or any family of electrical insulator materials can be used if they are able to maintain mechanical integrity over their intended lifetime and the operating temperatures to which they will be exposed.

The good thermally conductive material 42 has relatively high thermal conductivity, and optionally has good "wetting" ability to adjacent surfaces. The good thermally conductive material 42 should flow well at processing temperatures, which are typically around 20–30 degrees Celsius, and is optionally a slurry or a paste at those temperatures. Suitable good thermally conductive materials include, for example, pure metals such as gallium, mercury and woods metal. Such good thermally conductive materials typically have good electrical conductivity as well.

For the good thermally conductive material 42, metal alloys could be used instead of pure metals. The alloys or the pure metals could also optionally include fillers to increase viscosity and possibly to change the melting temperature. Optionally, the good thermally conductive material 42 is a liquid when applied and during operation of the electronic system, because the volume it occupies may change if it is frozen or solidified.

Pure gallium, for example, may be used as the good thermally conductive material 42. Alternatively, alloys such as gallium/tin or gallium/indium or gallium/indium/tin could also be used.

As also noted above, fillers could also optionally be used, such as powders, gels or fibers, such as refractory, (including ceramics such as aluminum oxide, boron-nitride, aluminum-nitride, etc.), metal powders (such as silver, copper, nickel, aluminum, palladium tungsten, gold, molybdenum, etc.) or elements from Group IV of the Periodic Table (such as carbon, silium, germanium, etc.). The dispersion of a filler in a metal or alloy typically requires both heat and mechanical agitation. The decision as to which filler to use and the relative amount, will depend upon the particular application, the type of metal or alloy used, the desired melting temperature of the resulting mixture and the desired viscosity.

The amounts of the electrical insulator material 36 and the good thermally conductive material 42 used in a particular situation depend upon surrounding circumstances including the nature of the materials 36, 42, the temperature, the volume of the gap 21 and the area of the surface of the component 14 (or DLA or overmold (not shown)) facing the gap 21.

When the electrical insulator material 36 is initially injected into the gap 21, as shown in FIG. 1b, a sufficient amount should be injected so that it will ultimately be able to confine the good thermally conductive material 42 between the component 14 and the planar body 18. However, ideally, the electrical insulator material should not extend beyond the edges of the component 14.

There are several methods for determining how much of the electrical insulator material 36 to inject, which would be known to those skilled in the art. For example, if the height of the gap 21 is known (ie: the distance between the component 14 and the planar surface 18), then the volume of the electrical insulator material 36 to be injected can be calculated. If the height of the gap 21 is not known, then there are several methods for determining the height, such as, for example, inserting a dip stick (not shown) into the hole 34. If the height of the hole 34 is known, then the height of the gap 21 is calculated by subtracting the height of the hole 34 from the dip stick measurement.

The amount of the good thermally conductive material 42 to inject depends upon the particular circumstances. There should be a sufficient amount of the good thermally conductive material 42 to bridge the gap 21 between the component 14 and the planar surface 18. However, there should not be so much good thermally conductive material 42 such that there would be insufficient electrical insulator material 36 to contain it between the component 14 and the planar surface 18. Similarly, there should not be so much good thermally conductive material 42 such that the injection of the good thermally conductive material 42 would push the electrical insulator material 36 beyond the edges of the component 14.

According to one aspect of an embodiment, there is approximately a ratio of three to seven of the good thermally conductive material 42 to the electrical insulator material 36. However, an infinite number of other ratios could also be used.

Numerous modifications and variations of the present invention are possible in light of the above teachings. It is therefore to be understood that within the scope of the appended claims, the invention may be practised otherwise than as specifically described herein.

For example, the embodiments noted above describe injecting the materials 36, 42 into the gap 21 between the circuit board structure 10 and the heat sink component 16. However, it is possible to apply the materials 36, 42 other than by injecting. For example, the materials could be applied to either a surface of the component 14 (or a DLA or an overmold (not shown)) or the planar surface 18 before the printed circuit board structure 10 and the heat sink structure 16 are affixed to one another.

As an example, an amount of the electrical insulator material 36 could be applied to the surface of the component 14 remote from the printed circuit board 12 by any method, such as that shown in FIG. 2a. Then a frozen or a relatively solid disc, or other shape, of the good thermally conductive material 42 is applied in the centre of the electrical insulator material 36, as shown in FIG. 2b. Alternatively, the frozen disc, or other shape, of the good thermally conductive material 42 could be applied first, and then electrical insulator material 36 could be applied around the perimeter of the disc. The circuit board structure 10 and the heat sink structure 16 are then brought towards each other, as suggested in the cross-sectional view of FIG. 2c. Then, the circuit board structure 10 is affixed to the heat sink structure 16 in a manner such as that shown in FIG. 1a. The result (not shown) is that the good thermally conductive material 42 is confined between the component 14 and the planar surface 18 by the electrical insulator material 36.

The good thermally conductive material 42 need not be solid or frozen as described above when applied. However, because the good thermally conductive material 42 may be harmful to circuits or other components (not shown) of the printed circuit board structure 10 or human beings if the good thermally conductive material 42 is splattered, it is optionally applied in solid or frozen form in this embodiment.

Figure 3:
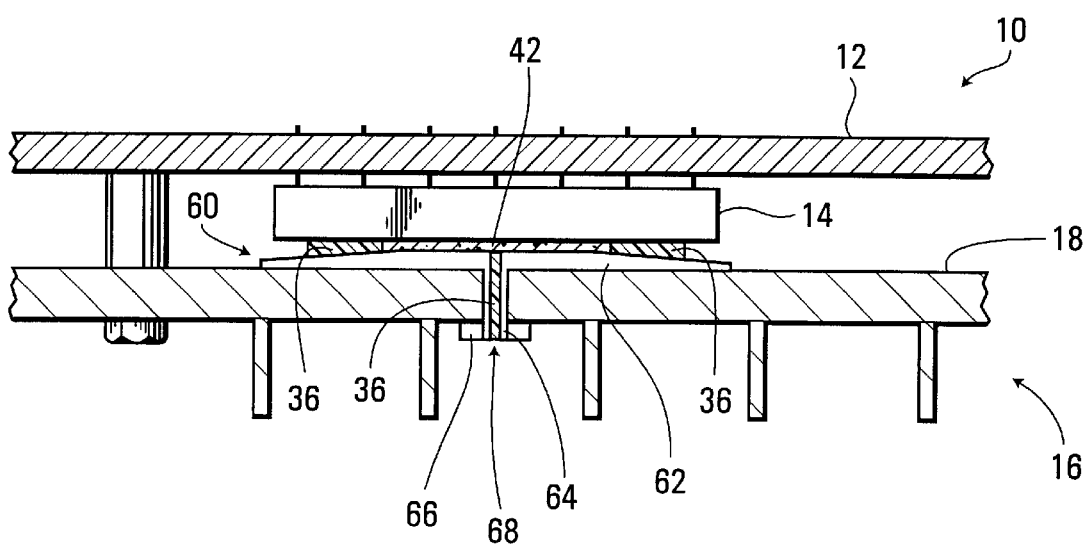
FIG. 3 is a cross-sectional view through a printed circuit board structure and a heat sink structure in accordance with another aspect of the present invention.

It is possible that after some period of use, a user may wish to separate the printed circuit board structure 10 from the heat sink structure 16 (for repairs, cleaning, modification, etc). Accordingly, it would be desirable if the electrical insulator material 36 and the good thermally conductive material 42 were not positioned in the gap 21 directly against the planar body 18. For example, as shown in FIG. 3, according to another embodiment, a thermally conductive pedestal structure 60, has a generally horizontal portion 62 and a stem portion 64 extending perpendicularly therefrom. The stem portion 64 is adapted to fit within the hole 34 of the heat sink structure 16. The pedestal structure 60 is affixed to the heat sink structure 16 by means of a nut 66 engaging an external thread on the stem portion 64. A bore 68 extends through the stem portion 64 and the horizontal portion 62 allowing the materials 36, 42 to be injected through the bore 68. In this embodiment, the materials 36, 42 are interposed between the component 14 and the horizontal portion 62 of the pedestal structure 60.

Other devices or means (not shown) could be used to separate the materials 36, 42 from the planar body 18, such as thermally conductive tape, for example.

If it is desired to separate the printed circuit board structure 10 from the heat sink structure 16, then it is also likely desirable that the good thermally conductive material 42 not be in a liquid state at the time of separation, to avoid the possibility of the good thermally conductive material 42 splattering, contaminating components, etc. Accordingly, prior to separating the circuit board structure 10 from the heat sink structure 16, the combination of all or part of the printed circuit board structure 10 and the heat sink structure 16 could be placed in a cold environment to freeze the good thermally conductive material 42.

As another potential problem, liquid metals often dissolve and amalgamate with many common materials used to fabricate printed circuit board structures 10, heat sink structures 16 and electronic components 14, which could destroy or compromise the integrity of these structures or components 10, 14 and 16.

To help overcome this problem, the good thermally conductive material 42 (a liquid metal such as gallium and/or its alloys, for example) may be dispersed as a filler material in a matrix gel which may be an organic substance such as soft acrylic, for example, or an inorganic substance such as silicone gel. The resulting material 42 (not shown) would be an encapsulation of a liquid metal by a dielectric substance which would limit the liquid metal from direct contact with electrical components 14 or structures 10 and 16.

As an alternative or additional means for protecting structures 10 and 16 and components 14 from direct contact with the liquid metal, the structures and components 10, 14 and 16 could include a film or barrier layer (not shown) to limit contact of the liquid metal with the components or structures 10, 14 and 16. For example, for an aluminum heat sink structure 16, a barrier layer may consist of tin metal plated over nickel over the base aluminum. As another option, a ceramic aluminum barrier could be used. Many other barriers could also be used.

What is claimed is:

1. An electronics system comprising a heat sink structure and a printed circuit board structure, the printed circuit board structure comprising a printed circuit board with at least one electronic component mounted upon a first side of the printed circuit board, the heat sink structure and the circuit board structure being affixed to each other wherein the electronic component is in a spaced relationship from the heat sink structure, the electronics system further comprising a means for creating a thermally conductive path from the heat sink structure to the electronic component wherein the means for creating a thermally conductive path comprises a good thermally conductive, electrically conductive material and an electrical insulator material wherein both of the good thermally conductive, electrically conductive material and the electrical insulator material are between the electronic component and the heat sink structure and the good thermally conductive, electrically conductive material is in direct contact with both a surface of the electronic component and a surface of the heat sink structure, and the good thermally conductive, electrically conductive material is confined and contained between the electronic component and the heat sink structure by the electrical insulator material.

2. The electronics system of claim 1 wherein the heat sink structure comprises one or more holes defined through the heat sink structure, each hole having its axis extending in a direction generally towards an electronic component.

3. The electronics system of claim 2 wherein each of the one or more holes comprises additional electrical insulator material.

4. The electronics system of claim 1 wherein the electrical insulator material is adhesive, to assist in adhering surfaces against which it is applied and to assist in confining the good thermally conductive, electrically conductive material within a volume in the thermally conductive contact between the electronic component and the heat sink structure.

5. The electronics system of claim 1 wherein the electrical insulator material does not extend beyond the periphery of the electronic component.

6. The electronics system of claim 1 wherein the ratio of the electrical insulator material to the good thermally conductive, electrically conductive material is approximately seven to three.

7. The electronics system of claim 1 wherein the good thermally conductive, electrically conductive material has an ability to flow at processing temperatures.

8. The electronics system of claim 1 wherein the electrical insulator material is initially a paste at processing temperatures and cures at room temperature to form a compliant seal having mechanical integrity.

9. The electronics system of claim 1 wherein the good thermally conductive, electrically conductive material is selected from one of gallium, mercury and woods metal.

10. The method of claim 9 wherein the good thermally conductive, electrically conductive material further comprises one of a powder or a fibre filler selected from a refractory material, a metal and an element or compound of Group IV of the Periodic Table.

11. The method of claim 1 wherein the good thermally conductive, electrically conductive material comprises gallium in combination with one of both metals selected from tin and indium.

12. The electronics system of claim 1 wherein the electrical insulator material is selected from one of silicone rubber, silicone gel, fluoro silicone rubber, acrylates and epoxy.

13. The electronics system of claim 1 wherein the heat sink structure comprises a heat sink and a means for separating the electrical insulator material and the good thermally conductive, electrically conductive material from the heat sink.

14. The electronics system of claim 1 wherein at least one of the heat sink structure and the electronic component comprises a barrier for protection from the good thermally conductive, electrically conductive material.

15. The electronics system of claim 14 wherein the barrier comprises tin plated over nickel.

16. The electronics system of claim 14 wherein the barrier comprises ceramic alumina.

* * * * *